(12) United States Patent
Stadler

(10) Patent No.: US 7,737,713 B2
(45) Date of Patent: Jun. 15, 2010

(54) APPARATUS FOR HOT-PROBING INTEGRATED SEMICONDUCTOR CIRCUITS ON WAFERS

(75) Inventor: Hermann Stadler, Willsbach (DE)

(73) Assignee: Atmel Automotive GmbH, Heilbronn (DE)

( * ) Notice: Subject to any disclaimer, the term of this patent is extended or adjusted under 35 U.S.C. 154(b) by 0 days.

(21) Appl. No.: 11/482,894

(22) Filed: Jul. 10, 2006

(65) Prior Publication Data

US 2007/0007986 A1 Jan. 11, 2007

(30) Foreign Application Priority Data

Jul. 9, 2005 (DE) ........................ 10 2005 032 174
May 18, 2006 (DE) ........................ 10 2006 023 257

(51) Int. Cl.
*G01R 31/02* (2006.01)
(52) U.S. Cl. .................................... 324/760; 324/158.1
(58) Field of Classification Search .......... 324/754–765
See application file for complete search history.

(56) References Cited

U.S. PATENT DOCUMENTS

| | | | |
|---|---|---|---|
| 4,978,914 A * | 12/1990 | Akimoto et al. ............. | 324/760 |
| 5,124,639 A | 6/1992 | Carlin et al. | |
| 5,198,290 A * | 3/1993 | Niioka ........................ | 442/378 |
| 5,525,911 A * | 6/1996 | Marumo et al. ............. | 324/754 |
| 5,550,482 A * | 8/1996 | Sano ........................... | 324/758 |
| 5,599,688 A * | 2/1997 | Grass .......................... | 435/29 |
| 5,833,970 A * | 11/1998 | Cox ............................ | 424/76.1 |
| 6,064,215 A * | 5/2000 | Kister ......................... | 324/754 |
| 6,078,186 A * | 6/2000 | Hembree et al. ............ | 324/755 |
| 6,081,110 A | 6/2000 | Moore et al. | |
| 6,232,790 B1 * | 5/2001 | Bryan et al. ................ | 324/754 |
| 6,861,856 B2 * | 3/2005 | Dunklee et al. ............. | 324/754 |
| 7,071,714 B2 * | 7/2006 | Eldridge et al. ............ | 324/754 |
| 2002/0079114 A1 * | 6/2002 | Enmoto et al. ............. | 174/35 R |
| 2003/0234609 A1 * | 12/2003 | Aziz et al. .................. | 313/504 |
| 2004/0119463 A1 | 6/2004 | Lou et al. | |
| 2004/0234752 A1 * | 11/2004 | Arnold et al. ............... | 428/336 |
| 2006/0152239 A1 * | 7/2006 | Nam et al. .................. | 324/760 |

FOREIGN PATENT DOCUMENTS

| | | |
|---|---|---|
| DE | 100 60 437 A1 | 6/2002 |
| DE | 101 44 705 A1 | 3/2003 |
| JP | 2000-228428 A | 8/2000 |
| WO | WO 00/19215 | 4/2000 |

OTHER PUBLICATIONS http://www.Azom.com The A to Z of Materials, Inc. 2000-2008. http://www.azom.com/details.asp?ArticleID=616 Retrieved on Jan. 16, 2008.*

* cited by examiner

*Primary Examiner*—Ha Tran T Nguyen
*Assistant Examiner*—Richard Isla Rodas
(74) *Attorney, Agent, or Firm*—Muncy, Geissler, Olds & Lowe, PLLC

(57) ABSTRACT

An apparatus for hot-probing integrated semiconductor circuits on wafers is disclosed that includes a support device for accommodating the wafer, a measurement card with electronic circuitry for functional verification of the integrated semiconductor circuits on the wafers, and a test head with contact needles which establishes an electrical contact between the measurement card and the integrated semiconductor circuits, wherein a detachable and coolable shield plate is provided between the measurement card and wafer in order to protect the apparatus.

27 Claims, 4 Drawing Sheets

APPARATUS FOR HOT-PROBING INTEGRATED SEMICONDUCTOR CIRCUITS ON WAFERS

This nonprovisional application claims priority under 35 U.S.C. §119(a) on German Patent Application Nos. DE 102006023257 and DE 102005032174, which were filed in Germany on May 18, 2006, and Jul. 9, 2005, respectively, and which are both herein incorporated by reference.

BACKGROUND OF THE INVENTION

1. Field of the Invention

The present invention relates to an apparatus for hot-probing integrated semiconductor circuits on wafers.

2. Description of the Background Art

Integrated semiconductor circuits are used in engine and transmission sections of automobiles, for example, where they are exposed to continuously changing temperature ranges reaching temperatures of 300° C. The thermal stresses must be taken into account as early as the manufacture and testing of the integrated semiconductor circuits. Once integrated semiconductor circuits have been fabricated, they undergo functional verification in a test step while they are still integrated in the wafer, which is to say before singulation.

The goal of the test process is to test the electrical functionality of the circuits at temperatures of up to 300° C. Testing at these temperatures is referred to as hot-probing of the wafer.

An apparatus for hot-probing the wafers includes a movable support device for the wafers, known as a hot chuck, upon which the wafers are heated to the desired temperatures. In addition, the apparatus for hot-probing contains a measurement card with electronic circuits arranged thereupon, by which the functionality of the integrated semiconductor circuits on the wafer can be checked. Arranged on the underside of the measurement card and connected in a force-locking manner thereto by a retaining mechanism is a test head with contact needles, referred to as a spider. The contact needles establish the electrical contact between the measurement card and the semiconductor circuits to be tested on the wafer. Once the wafer has been positioned, by the movable support device, beneath the test head at the correct point (in the x and y positions), the support device is moved upward (z position) and the contact needles penetrate the contact layer, which preferably is designed as an aluminum layer. In this context, an insulating metal oxide layer on the surface must be overcome when contact is made, especially in the case of contact surfaces containing aluminum. After the function of one integrated semiconductor circuit has been tested, the wafer is advanced to the next component, and contact is made again, until the desired circuits have been measured. During contact, the electronic circuits on the measurement card transmit test signals and evaluate the response signals coming back from the individual integrated semiconductor circuits on the wafer.

As a result of the high test temperatures, the measurement card and the associated electronics are exposed to very high stresses, which can significantly reduce the service life of the testing apparatus and, in particular, can lead to distortion of the electrical measurement results. Moreover, the measurement card deforms under the influence of heat, so that bending can occur in the center of the measurement card and the contact needles move out of the contact areas. Consequently, the apparatus must be readjusted, resulting in time losses and added costs.

DE 100 60 437 A1 teaches a needle card arrangement for parallel testing of a plurality of integrated circuits on a wafer, comprising a printed circuit board and a measurement card with multiple electronic circuit systems known as BOST (Build Outside Self Test) modules for functional verification of the integrated semiconductor circuits on the wafers. With the aid of test pattern generators, the BOST modules provide test signals to contact needles, which establish an electrical contact between the measurement card and the integrated semiconductor circuits. Provided between the printed circuit board and measurement card are heat dissipating means, or intermediate layers between the printed circuit board and measurement card, or openings in the printed circuit board for delivery of a coolant fluid. However, the means employed serve only to dissipate the waste heat generated by the BOST modules in operation; they are not suitable for removing the great heat produced by the hot chucks during hot-probing of wafers and thereby protecting the measurement card from the effects of heat.

In addition, WO 00/19215, which corresponds to U.S. Pat. No. 6,081,110 discloses a test apparatus for probing integrated semiconductor circuits on wafers that has a support device (chuck) for wafers that contains a heater for heating the support device and the wafers. While the support device for the wafers is arranged to be horizontally movable, the performance board and the measurement card with the electronic circuit systems for functional verification of the integrated semiconductor circuits on the wafers is rigidly fixed in place in the test apparatus. In order to avoid deformation of the measurement card under the influence of heat, a heat shield plate is screw-mounted by an annular insert to the housing of the apparatus and also to the measurement card, which includes a test head with contact needles. Moreover, the annular insert is also rigidly connected by a mechanical connector to the part of the test apparatus that contains the units for supplying electricity to the measurement card and the analysis units. The heat shield plate consists of a composite material that contains primarily aluminum. In addition, the heat shield plate has two different surfaces, one of which has a low absorptivity and the other of which has a low emissivity. However, since aluminum has a high coefficient of thermal expansion, quite high thermal deformations can occur in the plate center, or else high stresses if the plate is very stiff. Another disadvantage of this arrangement is that replacement of the measurement card, which is necessary for each change in the arrangement of the semiconductor circuits on the wafer, is very time-consuming and thus very costly, since the screw connections between the heat shield plate and either the measurement card or the test apparatus must be detached.

US 2004/0119463 A1 discloses an arrangement for a measurement card with a test head and contact needles which has flow paths for a fluid. Attached to the underside of the measurement card is a cover that encloses the space between the measurement card and contact needles. On account of the pressure differences, the fluid flows in through an opening on the top of the measurement card arrangement, passes through the flow paths, flows into the space between the measurement card and contact needles, and exits this space through gaps present between the contact needles and the cover. As fluid, compressed air or dry nitrogen are used. In this context, heat is to be supplied to or removed from the measurement card arrangement as needed. However, this arrangement is only suitable for heating or cooling the region of the contact needles or the region of the measurement card that is directly traversed by the flow paths. Cooling of the entire measurement card, which typically has very sensitive electronic circuits, is not achieved.

SUMMARY OF THE INVENTION

It is therefore an object of the present invention to solve the aforementioned problems in the measurement and hot-probing of integrated semiconductor circuits.

In the apparatus for hot-probing integrated semiconductor circuits on wafers there is included a support device for accommodating the wafer, a measurement card with electronic circuitry for functional verification of the integrated semiconductor circuits on the wafers, and, connected to the measurement card, a test head with contact needles which establishes an electrical contact between the measurement card and the integrated semiconductor circuits, there is provided between the measurement card and wafer a detachable and coolable shield plate.

Within the apparatus for hot-probing, the wafer is carried on a support device by which it can be moved in the x, y and z directions, so that all integrated semiconductor circuits on the wafer can be brought to the region of the contact needles on the test head. The thickness of the test head is only a few millimeters, and the penetration depth of the contact needles of the measurement head in the contact areas on the wafers is only a few micrometers. Thus, the distance between the measurement card and wafer is correspondingly small. Consequently great demands are placed on the material properties of the shield plate that is located between the measurement card and wafer. One advantage of this shield plate is the avoidance of direct exposure of the measurement card to electromagnetic radiation from the surface of the wafer or from the circuits being measured. As a result, significantly less stress is produced in the measurement card, and the service life of the measurement card and contact needles is increased. Another advantage of the shield plate is that it is detachably fastened to the apparatus for hot probing. If, for example, a test head with contact needles or a measurement card for testing specific integrated semiconductor circuits is to be replaced by another because a different product line of circuits is to be tested, both the shield plate and the other components can be replaced quickly because they are easily accessible and no screws or other mechanical connections need be detached. This is very important for the cost-effectiveness of the test apparatus, especially when changes in production are frequent or when the service life of the contact needles is short.

In a further embodiment of the invention, the shield plate has an opening for making contact by the contact needles with the contact areas of the semiconductor circuits. Investigations by the applicant have shown that the opening should be as circular as possible and have a minimal size, such that the spider can just still make contact with the wafer below the opening.

In another embodiment, the shield plate can, in an especially preferred manner, be used as a heat shield in order to shield the radiated heat from the measurement card and protect the measurement card and the contact needles from deformation due to thermal expansion with changing temperatures.

In a further embodiment, it is advantageous to connect the shield plate to the measurement card or a frame of the test apparatus in a force-locking manner. Investigations by the applicant have shown that a magnetic force connection is advantageous in this regard, especially when the shield plate is fixed in place by lateral fastening means, for example in the form of rails. In this regard, the separation of the shield plate from both the measurement card and the receiving apparatus can be set by means of the thickness of the lateral rails. Moreover, a full-area force-locking connection along the lengthwise direction of the shield plate can be achieved by means of the rails and several magnets that are let into a frame of the apparatus.

In another further embodiment, it has been shown to be advantageous for the replaceable shield plate to have a low coefficient of thermal expansion that preferably is less than or equal to $11 \cdot 10^{-6}$ 1/K. In this way, readjustment of the apparatus as a result of excessive deformation of the shield plate is avoided. Furthermore, it is advantageous for the shield plate to have an isotropic coefficient of thermal expansion.

The shield plate can also have a rib structure projecting out of the surface of the shield plate to stiffen and stabilize it, preferably located on the surface facing the measurement card. Moreover, other investigations by the applicant have shown that it is advantageous to provide a wind channel for a coolant between the replaceable shield plate and the measurement card. In this regard, the flow velocity of the coolant is usefully regulated by an electronic controller, preferably as a function of temperature, so that coolant is not supplied throughout the entire test time, but only when critical temperature ranges are reached. Furthermore, the coolant is preferably introduced by a nozzle below the measurement card, i.e. in the intermediate space formed by the shield plate and measurement card. It has been shown to be especially advantageous to introduce a coolant, preferably an inert gas such as, for example, nitrogen or a noble gas during hot-probing.

In a further embodiment of the apparatus, provision is made for the nozzles to be arranged below the measurement card at uniform intervals. In this context, an apparatus is provided at the height of the replaceable shield plate to evenly distribute the gas, which arrives in the apparatus through two inlet openings, among multiple nozzles of like geometry.

In this regard, targeted delivery of the coolant gas to the most thermally stressed locations on the shield plate can be achieved by ribs on the shield plate which are formed as guide channels for the coolant.

In another embodiment, it has proven to be advantageous to arrange a temperature sensor, preferably a platinum element, in the region of the maximum thermal stress on the shield plate, and to connect this element to the electronic coolant controller by means of a test pin holder. As soon as the temperature sensor measures a temperature at the most thermally stressed point on the replaceable shield plate that reaches a critical range, so that deformations of the shield plate or damage to the measurement card or the apparatus may be expected, the controller turns on the coolant supply. The coolant can then be delivered through the region in the form of a wind channel produced in the intermediate space between the measurement card and shield plate, where the coolant is preferably directed to the critical temperature zones (hot spots) by means of the ribs on the upper side of the shield plate.

In this regard, the shield plate can additionally be fixed to the apparatus by the test pin holder in addition to fastening means that are preferably on the sides. In order to provide for fast and simple replacement of the shield plate, the test pin holder in another embodiment has a magnet that is preferably screw-mounted within the measurement pin holder and is, in particular, made of a cobalt-samarium alloy.

Further, the shield plate can have a metallic layer, preferably made of inorganic metals, which preferably have an especially high reflectivity in the infrared wavelength range. In this regard, investigations by the applicant have shown that a thickness of this layer of even a few μm is sufficient to achieve considerable reflection. Furthermore, it has been shown that as a result of the reflection, faster heating and thus a shortening of the measurement time of the apparatus was achieved precisely at thermal load cycling of the wafer.

Other investigations by the applicant have shown that it is especially advantageous for the shield plate to be made of glass cloth impregnated with a silicone resin. In this context, a subsequent coating with Teflon additionally makes for a smooth surface. The surface, which as a result is very resistant to contamination in particular, is especially advantageous for use of the apparatus under clean-room conditions.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
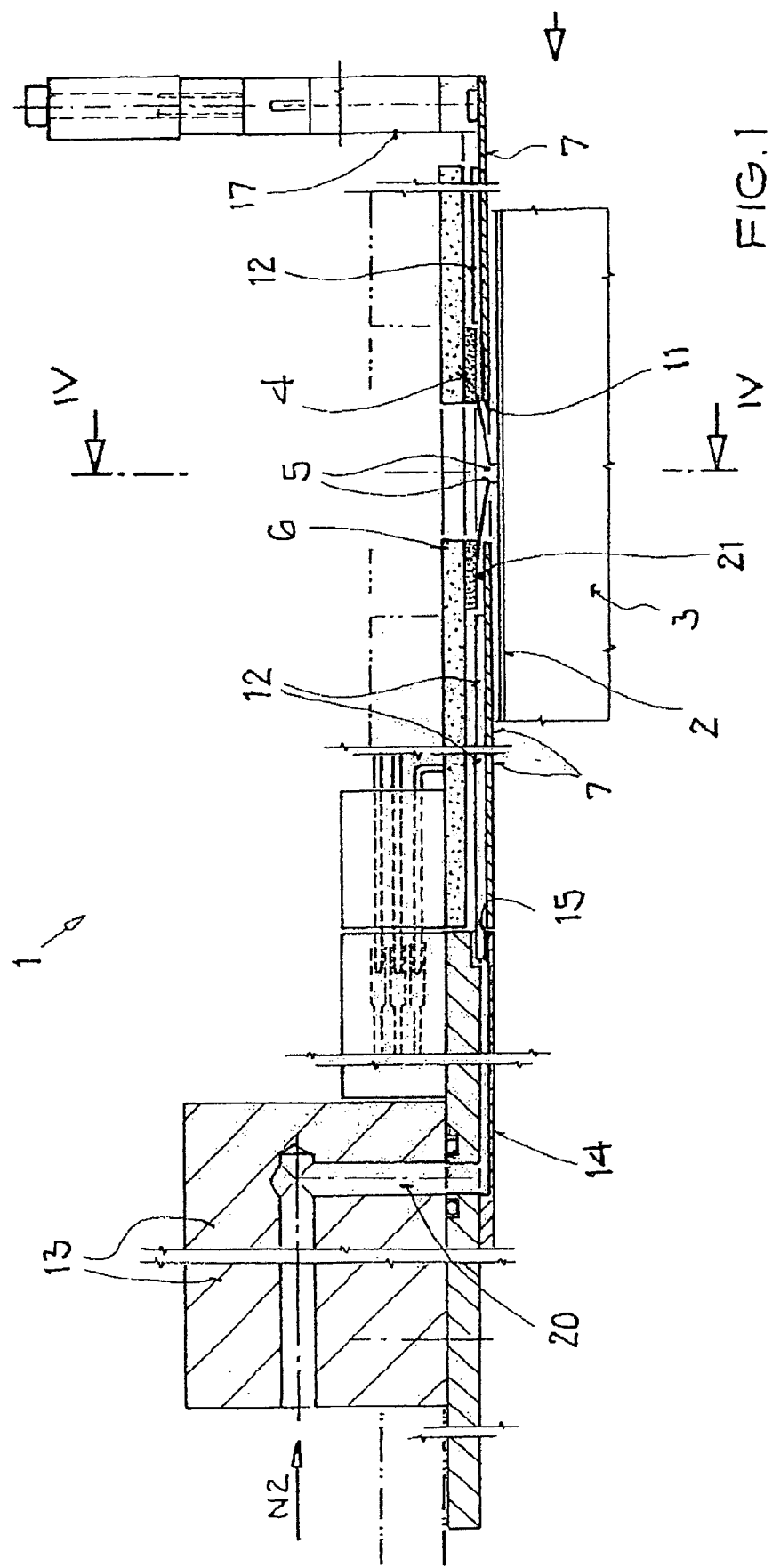
FIG. 1 shows a longitudinal section of an apparatus for hot-probing integrated circuits on wafers.

FIG. 1 shows a longitudinal section through an apparatus 1 for hot-probing integrated circuits on wafers. A wafer 2 with the integrated circuits to be tested rests on a hot chuck 3. The hot chuck 3 is a support device that applies suction to the wafer 2 by means of a vacuum pump, fixes it in place during the test process, and heats it to the desired test temperature. In addition, the hot chuck 3 can be moved in the x, y and z directions so that each of the individual components on the wafer 3 can be positioned under a test head 4 having multiple contact needles 5. The test head 4 is affixed to the underside of a measurement card 6. Located on the measurement card 6 are the circuit elements by which the functionality of the integrated circuits on the wafer 2 can be tested.

To protect the measurement card 6 and the other components of the overall apparatus 1, a shield plate 7 is provided between wafer 2 and measurement card 6. In addition, the apparatus 1 is provided with lines 20 through which a gaseous coolant, preferably nitrogen, is introduced into a wind channel 21 between the measurement card 6 and the shield plate 7 during the test process.

Figure 2:
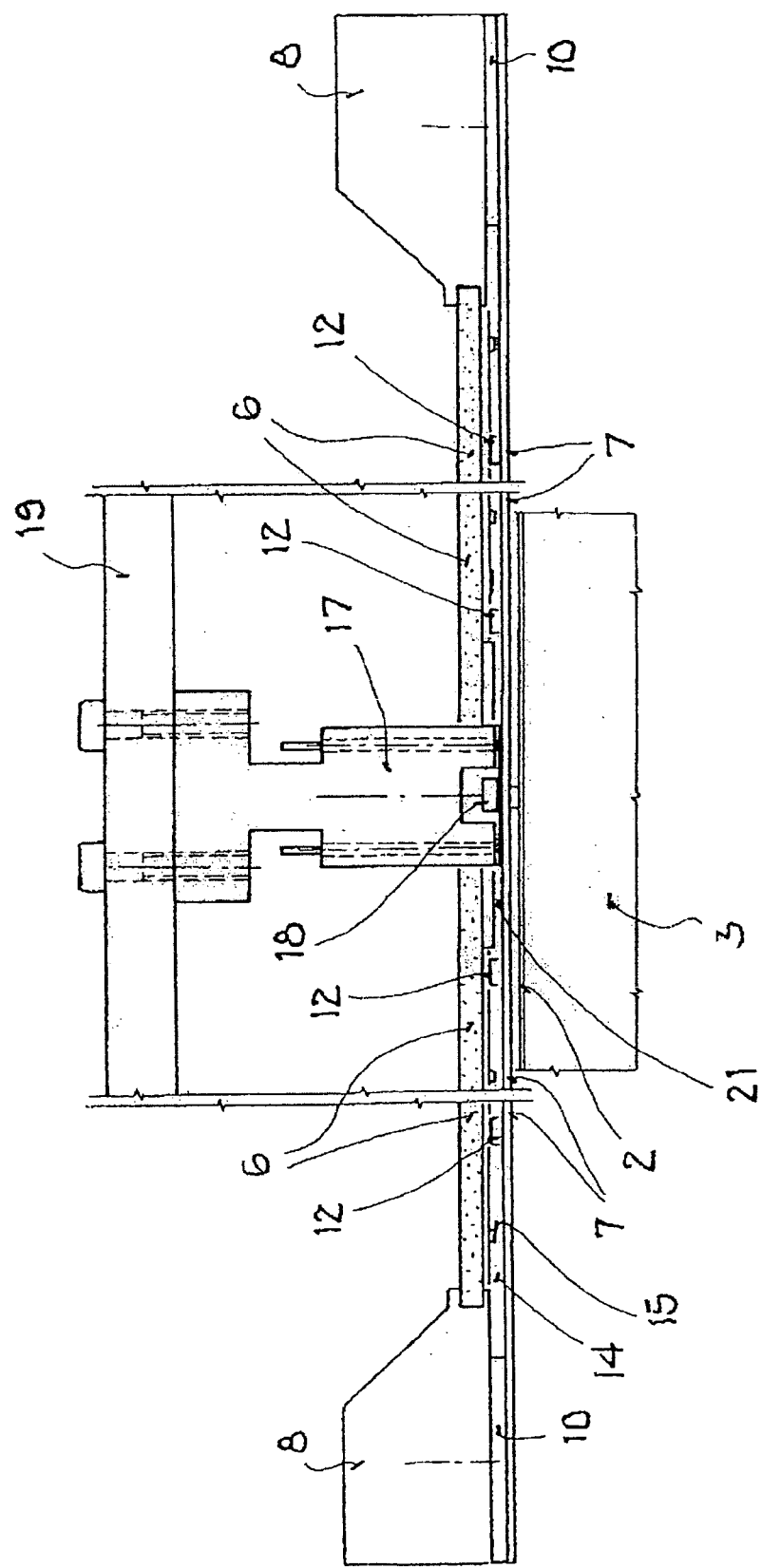
FIG. 2 shows a section through a measurement card and a test head with contact needles.

FIG. 2, which shows a cross-section through a measurement card 6 and the test head 4 with contact needles 5, makes clear how the shield plate 7 can be fastened to the apparatus for hot-probing 1. Magnets 9 are let into a frame 8 of the apparatus 1 to which the measurement card 6 is also fastened. The shield plate 7, which has a metallic rail 10 on each edge of the side facing the measurement card 6, is fastened to the frame 8 by these magnets. Very short replacement times are ensured by this, since the shield plate 7 can be fastened to or removed from the apparatus 1 with a single movement in each case. Thus the measurement card 6 remains easily accessible in spite of the additional component.

The shield plate 7 can be made of fiberglass cloth that is impregnated with silicone resin and has a coefficient of thermal expansion of $11 \cdot 10^{-6}$ 1/K, which thus approximately corresponds to the coefficient of thermal expansion of steel, $\alpha = 12 \cdot 10^{-6}$ 1/K. In the event of thermal stress and the associated expansion, therefore, stresses do not arise between the rails 10 and the shield plate 7.

Figure 3:
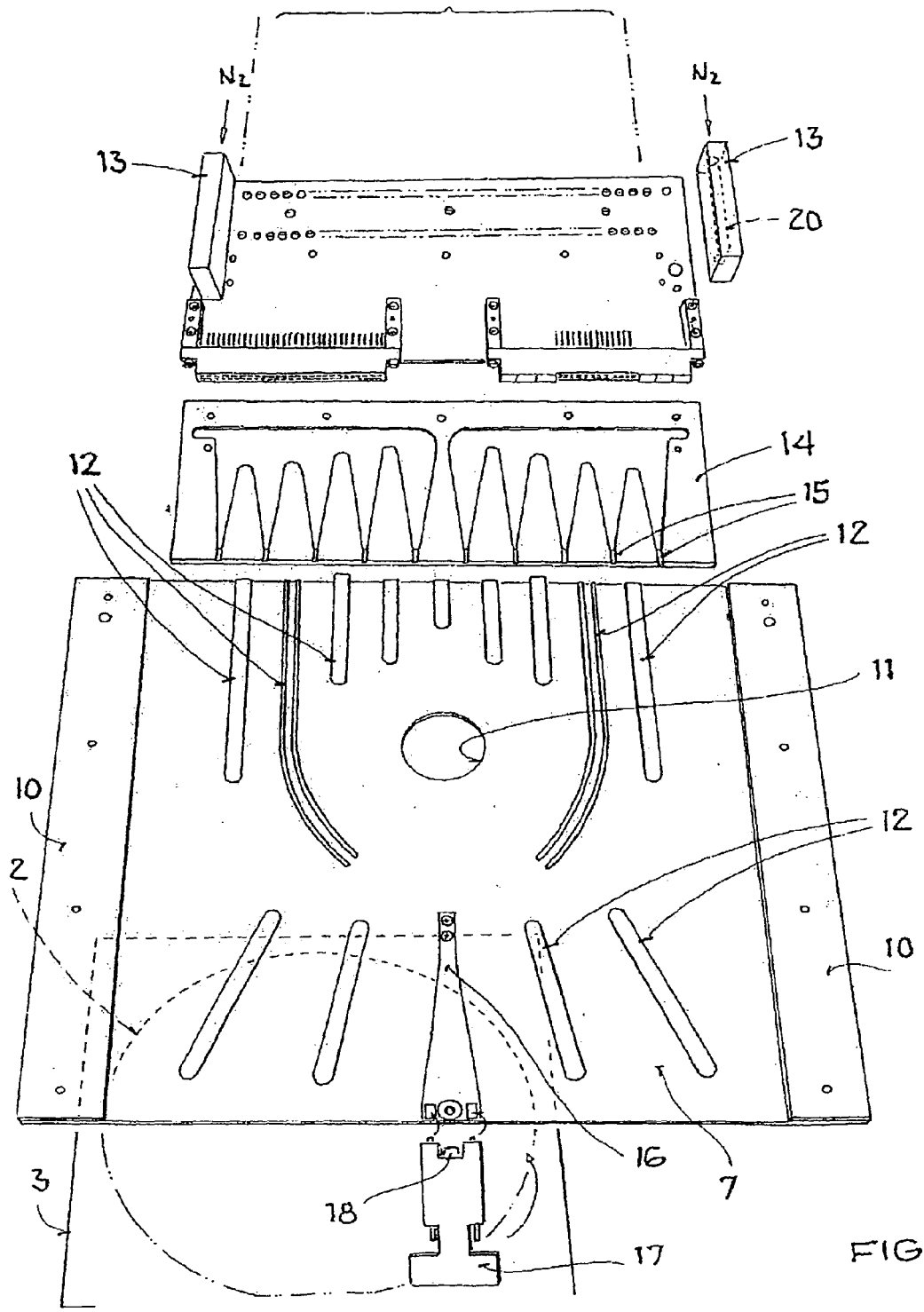
FIG. 3 shows a perspective view of the individual parts.

FIG. 3 shows a perspective view of the individual components of the inventive apparatus. The support device 3 for the wafers 2 is visible in the foreground. Located above is shield plate 7, which has a metallic rail 10 at each side. Provided in the center of the shield plate 7 is an opening 11 for the test head with the contact needles, although these are not shown in this figure.

It has been shown in the functional verifications that regions with especially high temperatures, known as hot spots, form on the shield plate 7 primarily behind the opening 11. To avoid such hot spots, which of course also reflect the areas of highest temperature stress on the measurement card 6, the shield plate 7 is designed such that a wind channel 21 is produced between the measurement card 6 and the shield plate 7.

To this end, ribs 12 are arranged on the side of the shield plate 7 facing the measurement card, which ribs channel a gaseous coolant, preferably nitrogen, such that the coolant preferably arrives in the region of maximum thermal stress.

For this reason, the ribs 12 are provided in different lengths, different orientations, and different thicknesses. On account of the reinforcement of the material of the shield plate 7, these ribs also serve to stiffen and stabilize the plate. They ensure that the shield plate 7 does not bend under the effects of heat, which could cause damage to the semiconductor circuits due to the small distances between the measurement card and wafer.

In order to avoid turbulence of the coolant in the vicinity of the test head or the contact needles, which could lead to disruption of the test processes, the coolant should flow in the wind channel 21 in as laminar a fashion as possible. To this end, the coolant is supplied through two inlet openings 13 of an apparatus 14 that distributes the coolant among multiple discharge nozzles 15 arranged parallel to one another. The apparatus 14 with the discharge nozzles 15 is arranged such that it introduces the coolant precisely into the intermediate space between two ribs 12 and in the center between measurement card 6 and shield plate 7.

According to an advantageous further development of the invention, a temperature sensor 16 is provided in the region of the maximum thermal stress. The temperature sensor 16, which in the present example is a platinum element, is connected by means of a test pin holder 17 to an electronic controller (not shown), which controls the supply of coolant when critical temperatures are reached in the hot spot region.

In this regard, the test pin holder 17 is designed such that it is fastened to the temperature sensor 16 by means of a screw-mounted magnet 18, thus ensuring the connection of contact areas 19 on the temperature sensor and contact areas 20 on the test pin holder 17.

Figure 4:
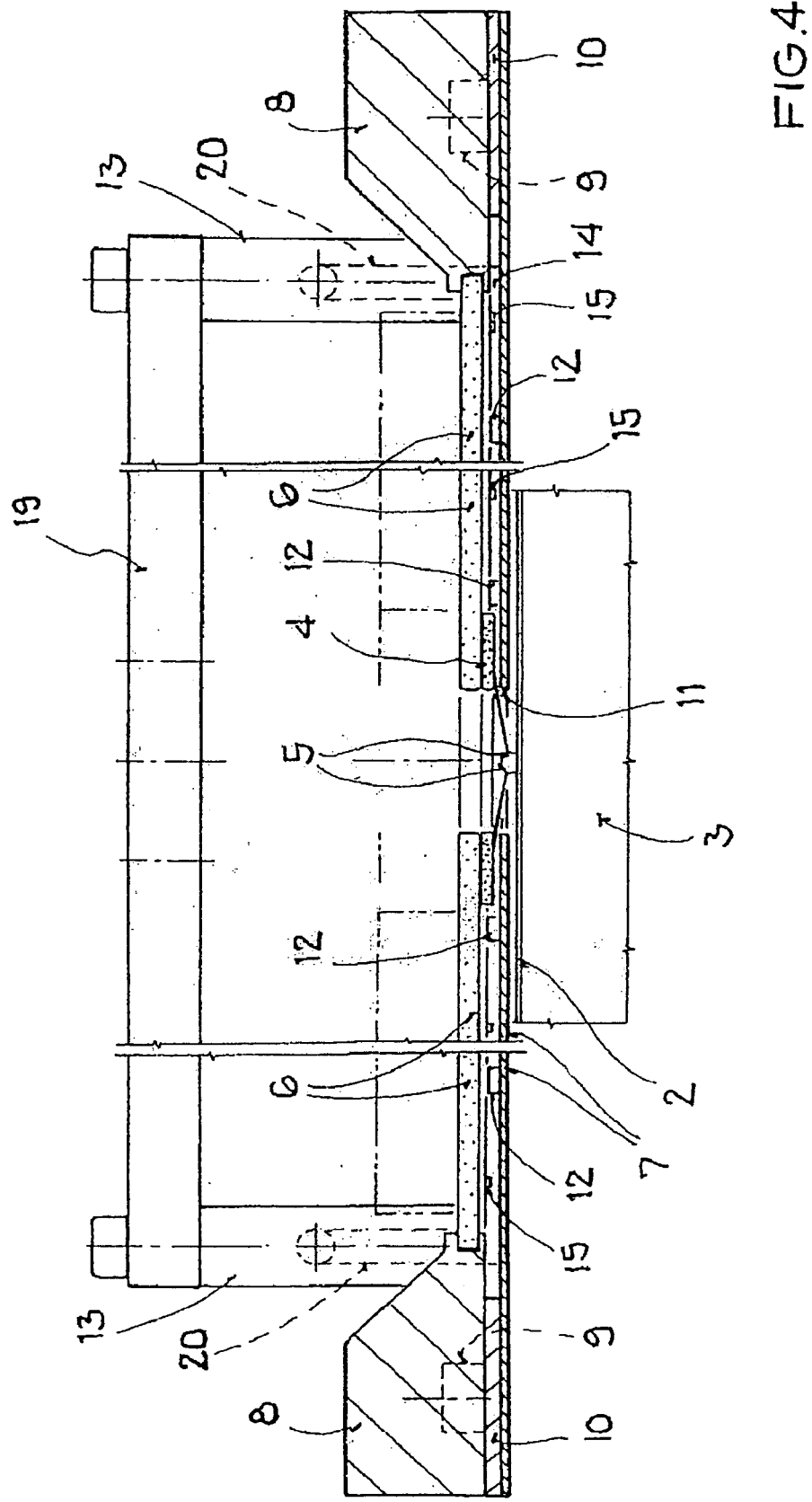
FIG. 4 shows a view of a test pin holder and a measurement card.

FIG. 4, which shows a front view of the apparatus 1, clearly illustrates how the test pin holder 17 is fastened to an additional frame 19 of the apparatus 1, which provides the connection for electronic control for the coolant supply, while simultaneously serving as additional retention for the shield plate 7.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An apparatus for hot-probing integrated semiconductor circuits on wafers, the apparatus comprising:
    a support device for accommodating a wafer;
    a measurement card having electronic circuitry for functional verification of the integrated semiconductor circuits on the wafers;
    a test head connected to the measurement card, the test head having contact needles for establishing an electrical contact between the measurement card and the integrated semiconductor circuits in a test area;
    a detachable heat shield plate provided between the measurement card and the wafer, the shield plate including an opening and the test head needles extending into said opening; and
    at least one rail fixably provided on the shield pate,
    wherein the shield plate is spaced from the measurement card by a gap contiguous with said opening, and
    wherein the at least one rail forms a full-area force-locking connection for the measurement card along a lengthwise direction of the shield plate.

2. The apparatus according to claim 1, wherein the shield plate has an opening for providing contact to the contact needles with the contact areas of the semiconductor circuits.

3. The apparatus according to claim 1, wherein the shield plate is connected to the measurement card or a frame of the apparatus for hot-probing in a force-locking manner or by a magnetic force connection.

4. The apparatus according to claim 1, wherein the shield plate has a lateral fastener or rails, and wherein a separation between the shield plate and the measurement card is based on the lateral fastener or rails.

5. The apparatus according to claim 1, wherein the shield plate has a low coefficient of thermal expansion, which is less than or equal to $11*10^{-6}$ 1/K.

6. The apparatus according to claim 1, wherein the shield plate has an isotropic coefficient of thermal expansion.

7. The apparatus according to claim 1, wherein the shield plate includes a rib structure that projects out of a surface of the shield plate to stiffen and stabilize the shield plate.

8. The apparatus according to claim 1, wherein a wind channel for a coolant is provided between the shield plate and the measurement card.

9. The apparatus according to claim 8, wherein the flow velocity of the coolant is regulated by an electronic controller or by a function of temperature.

10. The apparatus according to claim 8, wherein at least one nozzle is arranged below the measurement card for introducing the coolant.

11. The apparatus according to claim 10, wherein nozzles are arranged below the measurement card at substantially equal intervals.

12. The apparatus according to claim 8, wherein, for targeted delivery of the coolant to the most thermally stressed locations on the shield plate, ribs are provided that form guide channels for the coolant.

13. The apparatus according to claim 1, wherein a temperature sensor or a platinum element is arranged in a region having the highest thermal stress on the shield plate.

14. The apparatus according to claim 13, wherein the temperature sensor is connected to the electronic coolant controller by a test pin holder.

15. The apparatus according to claim 14, wherein the shield plate is secured to a frame of the apparatus by the test pin holder.

16. The apparatus according to claim 15, wherein the test pin holder has a magnet for securing the shield plate.

17. The apparatus according to claim 16, wherein the magnet is made of a cobalt-samarium alloy, and is arranged such that it can be screwed into the measurement pin holder.

18. The apparatus according to claim 1, wherein the shield plate has a metallic layer which is reflective in the infrared wavelength range.

19. The apparatus according to claim 18, wherein the thickness of the metallic layer is at least 1 μm.

20. The apparatus according to claim 1, wherein said wafer is a heated wafer.

21. An apparatus for hot-probing integrated semiconductor circuits on wafers, the apparatus comprising:
    a support device for accommodating a wafer;
    a measurement card having electronic circuitry for functional verification of the integrated semiconductor circuits on the wafers;
    a test head connected to the measurement card, the test head having contact needles for establishing an electrical contact between the measurement card and the integrated semiconductor circuits;
    a heat shield plate provided between the measurement card and the wafer, the shield plate including an opening and the needles extending into the opening, the shield plate defining with the measurement card a flow path from a fluid source to the opening; and
    at least one rail fixably provided on the shield plate, the at least one rail forming a full-area force-locking connection for the measurement card along a lengthwise direction of the shield plate.

22. The apparatus of claim 21 wherein said shield plate includes ridges for directing fluid flowing along said shield plate.

23. The apparatus according to claim 21, wherein said wafer is a heated wafer.

24. An apparatus for hot-probing integrated semiconductor circuits on wafers, the apparatus comprising:
    a measurement card having electronic circuitry for functional verification of integrated semiconductor circuits on the wafers;
    a test head connected to the measurement card and including contact needles for establishing an electrical contact between the measurement card and the integrated semiconductor circuits;
    a detachable heat shield plate overlying the measurement card and including an opening surrounding the needles; and
    at least one rail fixably provided on the shield plate, the at least one rail forming a full-area force-locking connection for the measurement card along a lengthwise direction of the shield plate,
    wherein the shield plate at least partially defines a fluid flow path from a fluid source to the opening.

25. The apparatus of claim 24 wherein the fluid flow path is defined by the measurement card and the shield plate.

26. The apparatus of claim 24 wherein the shield plate includes a plurality of ridges for guiding fluid flowing along said shield plate.

27. The apparatus according to claim 24, wherein said wafer is a heated wafer.

* * * * *